(12) United States Patent
Sankman et al.

(10) Patent No.: US 6,430,058 B1
(45) Date of Patent: Aug. 6, 2002

(54) INTEGRATED CIRCUIT PACKAGE

(75) Inventors: Bob Sankman, Phoenix; Hamid Azimi, Chandler, both of AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/453,007

(22) Filed: Dec. 2, 1999

(51) Int. Cl.⁷ .................................................. H01R 9/00
(52) U.S. Cl. ........................................ 361/773; 361/774
(58) Field of Search ............................... 361/773, 774, 361/792, 795, 734, 738, 782, 767, 793, 794, 780; 174/262, 264, 266, 255; 257/697, 700, 724, 723

(56) References Cited

U.S. PATENT DOCUMENTS

| | | | |
|---|---|---|---|
| 4,634,041 A | | 1/1987 | Prasad et al. ................. 228/124 |
| 4,672,152 A | * | 6/1987 | Shinohara et al. ........... 174/68.5 |
| 4,970,570 A | | 11/1990 | Agarwala et al. ............. 357/68 |
| RE34,887 E | * | 3/1995 | Ushifusa et al. .............. 361/795 |
| 5,442,239 A | | 8/1995 | DiGiacomo et al. .......... 257/781 |
| 5,448,016 A | | 9/1995 | DiPaolo et al. ............. 174/126.1 |
| 5,640,052 A | | 6/1997 | Tsukamoto ................... 257/781 |
| 5,718,367 A | | 2/1998 | Covell, II et al. ............ 228/254 |
| 5,879,568 A | * | 3/1999 | Urasaki et al. ................. 216/18 |
| 5,986,339 A | * | 11/1999 | Pai et al. ....................... 257/700 |
| 6,054,652 A | * | 4/2000 | Moriizumi et al. ........... 174/261 |
| 6,077,725 A | | 6/2000 | Degani et al. ................. 438/108 |
| 6,136,623 A | * | 10/2000 | Hofstetter et al. .............. 438/28 |

FOREIGN PATENT DOCUMENTS

| | | |
|---|---|---|
| EP | 0883173 | 12/1998 |
| GB | 2324415 | 10/1998 |
| JP | 02-260599 | 10/1990 |
| JP | 08-181450 | 7/1996 |
| JP | 10-145043 | 5/1998 |
| JP | 10-200266 | 7/1998 |

* cited by examiner

*Primary Examiner*—Neil Abrams
*Assistant Examiner*—Son V. Nguyen
(74) *Attorney, Agent, or Firm*—Schwegman, Lundberg, Woessner & Kluth P.A.

(57) ABSTRACT

An integrated circuit package is provided that includes a multi-layer organic substrate. The substrate has conductive vias provided between isolated conductive layers. The vias are formed using a laser to cut through a dielectric layer separating the conductive layers. External interconnects in the form of T-shaped pins are soldered to the substrate of the integrated circuit package. An integrated circuit can be attached to the substrate using a flip-chip technique.

18 Claims, 4 Drawing Sheets

INTEGRATED CIRCUIT PACKAGE

TECHNICAL FIELD OF THE INVENTION

The present invention relates generally to integrated circuits and in particular the present invention relates to integrated circuit packaging.

BACKGROUND OF THE INVENTION

Integrated circuits (IC's) are made up of electronic components linked together by conductive connections to form one or more functional circuits. IC's are typically formed in a piece of silicon called a chip or die. Silicon dice can be formed in a wafer that is a sheet of silicon with a surface that is subject to a series of fabrication steps to form a pattern of identical IC's. The IC's are separated from each other by a repeating pattern of scribe lines, also called saw lines, in the surface of the wafer that serve as boundaries between the dice. One IC is formed in each die. At a stage in a fabrication process the dice are diced (cut apart) from the wafer along the scribe lines and each die is bonded to a substrate to form an IC package.

A substrate is a relatively flat and rigid structure that provides mechanical support for the die in the IC package, transmits signals to and from the IC, and can also transfer heat that is generated during the operation of the IC. The substrate may also be called a carrier. The substrate includes conductive leads connected to respective bonding pads on the die so that the IC may exchange signals with other circuits in the IC package and circuits connected to the IC package. Additional elements such as resistors and capacitors that are not readily included in the IC may be attached to the top or bottom of the IC package. The IC package may be applied to a circuit board assembly that comprises systems of interconnected IC packages to form an electronic device such as a computer or a cellular phone.

One method of bonding a die to a substrate in an IC package is called a flip-chip bonding method. One version of the flip-chip bonding method is formally known as the controlled collapse chip connection or C4 method. In the flip-chip bonding method, solder bumps are placed on bonding pads on the dice while they are connected together in the wafer. The wafer is then diced to separate the dice. Each die is then turned over, or flipped, and aligned with a corresponding pattern of bonding pads or solder bumps on a substrate. A second reflow procedure is carried out to join the bumps to form a series of solder columns between the die and the substrate. The solder columns serve as conductive connections or leads between an IC in the die and the substrate through which I/O signals are transmitted, and power is delivered As microelectronic products move toward greater levels of integration, increasing functionality, and enhanced performance, the complexity of packaging technology grows in direct proportion. For example, the evolution of silicon processes into finer and finer feature sizes has resulted in microprocessor designs that are capable of achieving higher system clock speed and faster rise times.

As a result, the level of integration and the density of interconnects between integrated circuits, such as processor chips, and substrates has been increased tremendously. Thus, coupling the integrated circuits to a substrate for electrical and physical connectivity to external devices provides increased challenges as the interconnect density increases.

For the reasons stated above, and for other reasons stated below which will become apparent to those skilled in the art upon reading and understanding the present specification, there is a need in the art for new substrate technologies with enhanced interconnect density.

SUMMARY OF THE INVENTION

The above mentioned problems with integrated circuit packaging and other problems are addressed by the present invention and will be understood by reading and studying the following specification.

In one embodiment, an integrated circuit package comprises an integrated circuit die, an organic multi-layer substrate and T-shaped conductive pins. The organic multi-layer substrate comprises a dielectric base layer, and first conductor, first dielectric, and second conductor layers respectively fabricated on a top and a bottom of the dielectric base layer. The T-shaped conductive pins are soldered to an outer most conductor layer located on a bottom of the substrate.

In another embodiment, a microprocessor package comprises a microprocessor die, an organic multi-layer substrate and T-shaped conductive pins. The organic mult-layer substrate comprises a dielectric base layer, a first conductor layer fabricated on a top and a bottom of the dielectric base layer, a first dielectric layer fabricated on the first conductor layer, a second conductor layer fabricated on the first dielectric layer, a second dielectric layer fabricated on the second conductor layer, and a third conductor layer fabricated on the second dielectric layer. The organic multi-layer substrate thereby has at least eleven layers, of which six layers are conductor material. The T-shaped conductive pins are soldered to the third conductor layer located on a bottom of the substrate.

In yet another embodiment, a method of fabricating an integrated circuit substrate is provided. The method comprises forming a first conductive layer on a base dielectric layer, forming a first dielectric layer on the first conductive layer, forming a first via through the first internal dielectric layer using a laser to expose the first conductive layer, and forming a second conductive layer on the first internal dielectric layer. The second conductive layer coats the interior surface of the first via to form conductive paths through the first dielectric layer.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
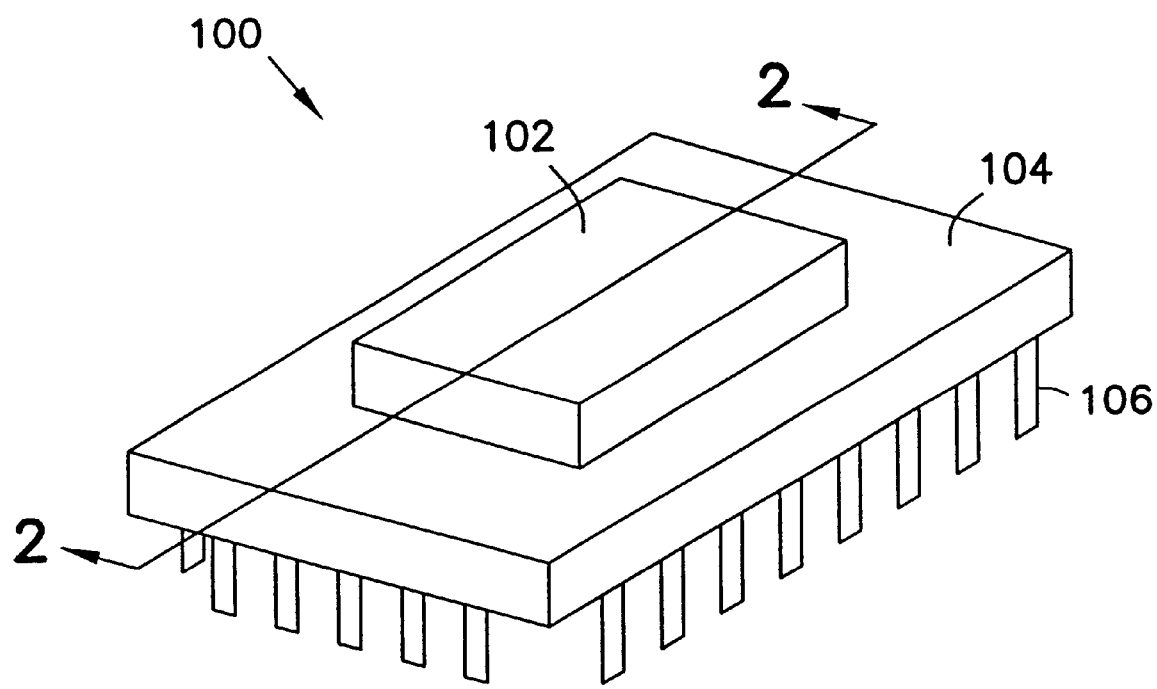
FIG. 1 is a perspective view of an integrated circuit package of the present invention.

A simplified perspective view of an integrated circuit package 100 is provided in FIG. 1. The package includes at least one integrated circuit die 102 and a substrate 104. The substrate includes numerous conductive pins 106 that downwardly extend from the substrate and are provided for electrical connection to an external device. The illustrated package includes beneficial features that are explained in greater detail below. Specifically, interconnect pins as described herein provide for increased conductor routing space when compared to packages that have interconnect pins inserted into a substrate.

Figure 2:
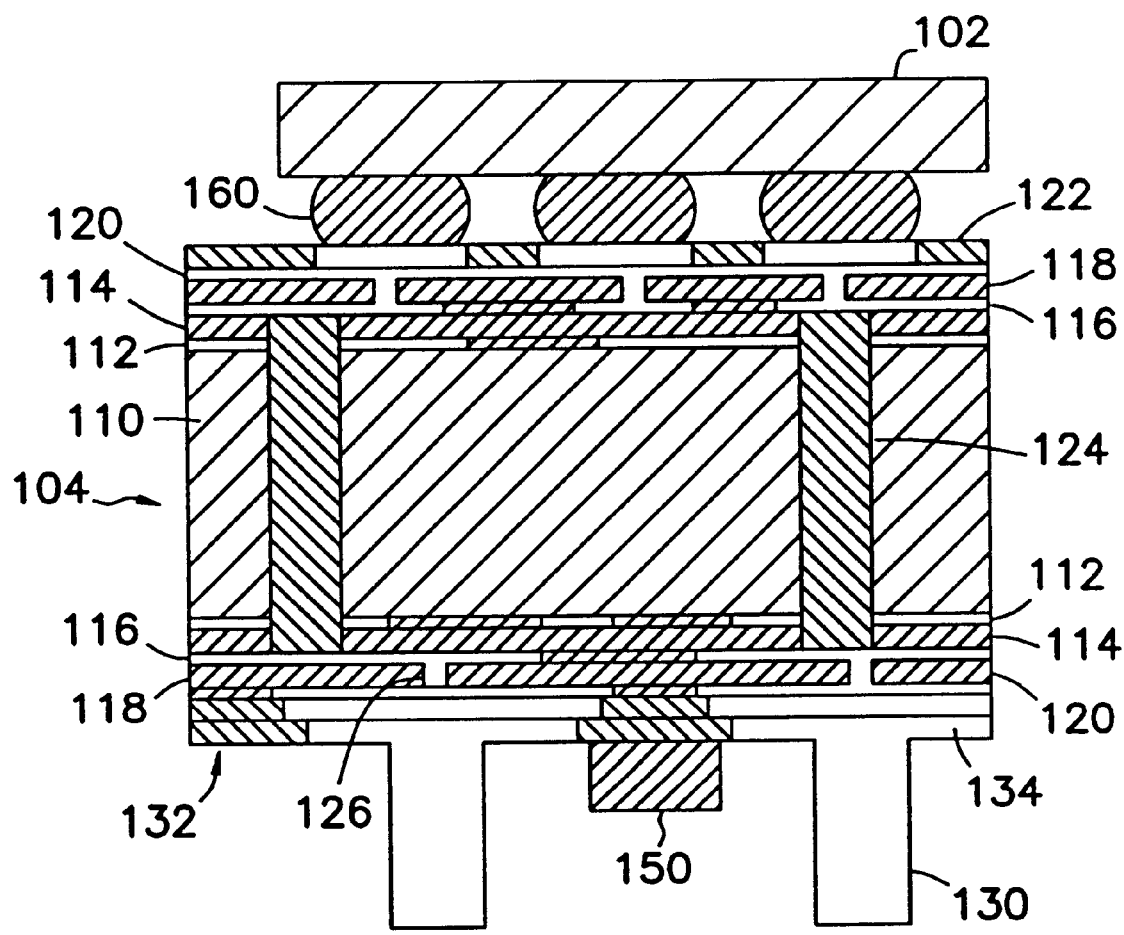
FIG. 2 is a cross section view of one embodiment of the integrated circuit package of FIG. 1;.

A partial cross section of an embodiment of the present invention is illustrated in FIG. 2. The substrate 104 includes a plurality of layers that together form a common structure. In one embodiment, the substrate includes an organic base dielectric layer 110. On top of the base dielectric layer is a layer of conductor material 112, such as copper. Conductor layer 112 is covered with a first internal layer of dielectric material 114. A second conductive layer 116 is provided on top of the first internal layer of dielectric material 114. A second internal layer of dielectric material 118, fabricated on top of second conductive layer 116, is covered by a third conductive layer 120. The third conductive layer can be an external layer that is covered with a solder mask 122 to control the placement of solder. The same conductor-dielectric-conductor-dielectric-conductor is provided on the bottom of base dielectric layer 110.

The conductive layers are patterned to form conductive traces, or paths. Interconnecting the multiple layers of conductors through the base dielectric layer is accomplished through plated through holes (PTH) 124. The plated through holes in one embodiment are formed using either a drill or a laser to cut a holes through the base layer and the first conductor and dielectric layers. The holes are plated with a conductor when second conductive layer 116 is formed. Additional plated vias 126 can be provided between the first, second and third conductive layers. Both the PTH's and the vias are used to ease package conductor routing.

Traditionally, photo-lithography could be utilized to make vias in the substrates. The use of photo-lithography process brings two disadvantages that can eventually prevent the formation of high density interconnects in the substrate. First, is the limitation in the via size. Commercially available photosensitive materials have limited resolution when it comes to smaller via sizes. Second, is the limitations with photosensitive materials with respect to a combination of mechanical properties, moisture absorption, and dielectric constant. In the present invention, laser cut vias are used to overcome limitations of prior techniques.

Figure 4:
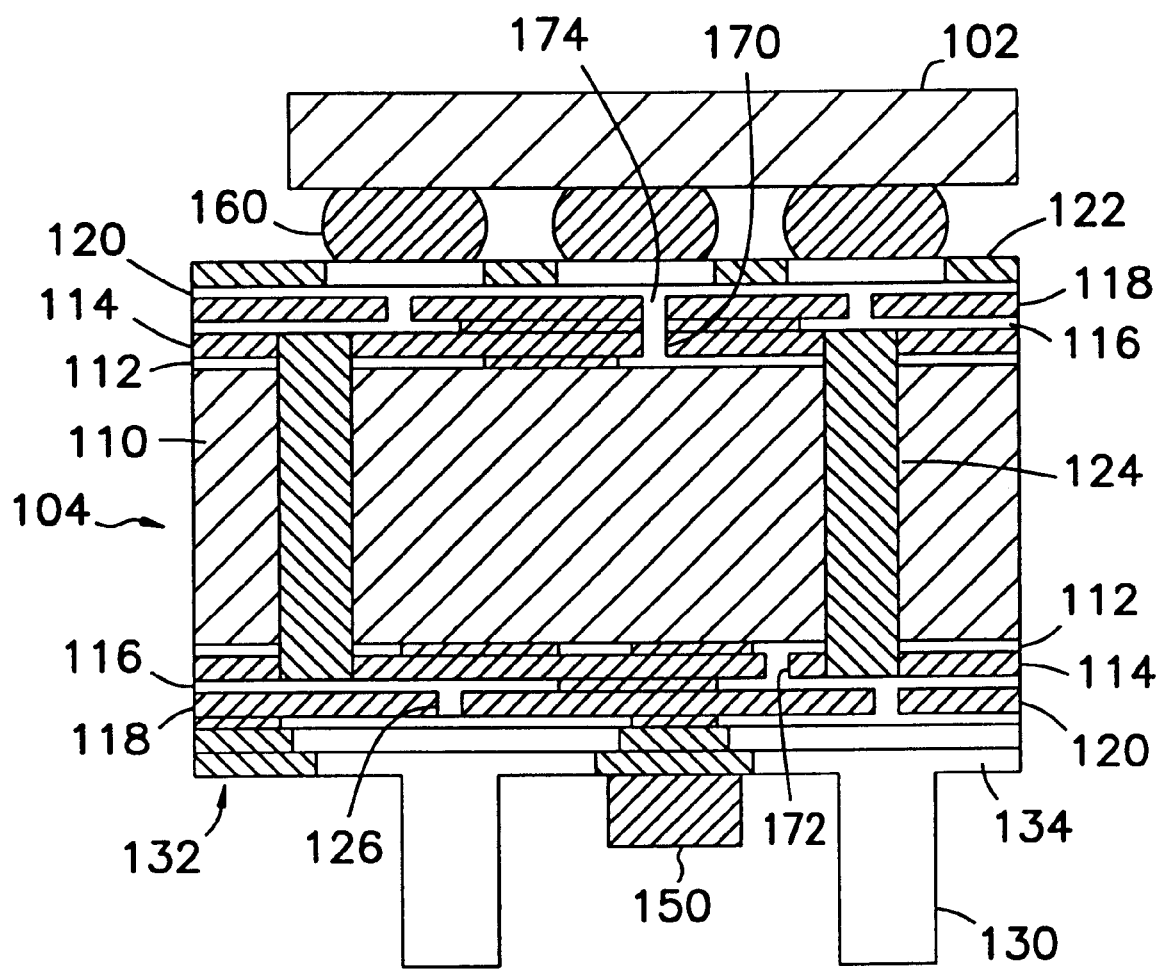
FIG. 4 is a cross section view of another embodiment of the integrated circuit package of FIG. 1.

Laser technology can create via sizes down to diameters of 10 μm, or smaller. In contrast, photo-lithography materials can be limited to 50–60 μm vias. Furthermore, laser technology can make skip vias formation possible. Skip vias are used to comnect two conductive layers that are separated by a third layer, as illustrated in FIG. 4. Skip via 174 connects conductive layers 112 and 120 while skiping intermediate conductive layer 116. Layer 116 has a clearance region formed in the location of the skip via to prevent electrical contact between the layer and the via. As such, skip vias can be used to relieve routing density, save real estate, and alleviate loop inductance. In addition, non-photo sensitive dielectric materials can be added to the selection of dielectric material candidates several dielectric materials can be used that are commercially available at lower cost than dielectric materials used in packages using photo-lithography processes.

During fabrication, first conductive layers 112 are formed on base dielectric layer 110. This fabrication process can be conducted by a supplier. As such, the base dielectric layer can be provided with the conductive layers pre-attached. The first conductive layers are patterned to form desired interconnects, or traces. First internal dielectric layers 114 are then formed on the pattered first conductors. Vias are then formed for plated through holes 124. These vias can be formed by either mechanical drilling or laser cutting. Second conductive layers 116 are then formed on each side of the substrate. These layers coat the interior surface of the vias to form conductive paths through the substrate. The plated vias have an interior core that is then filled with epoxy, or other similar material. The fill material can be either insulating or conducting in nature. A second coating of conductor material is build up on the second conductive layer. That is, a second deposition process is provided to increase the thickness of the second conductor layer and cover the ends of the plated through holes. Covering the ends of the plated through holes allows for secondary vias 126, as explained below. The second conductive layers are then patterned to form selected traces.

Figure 3:
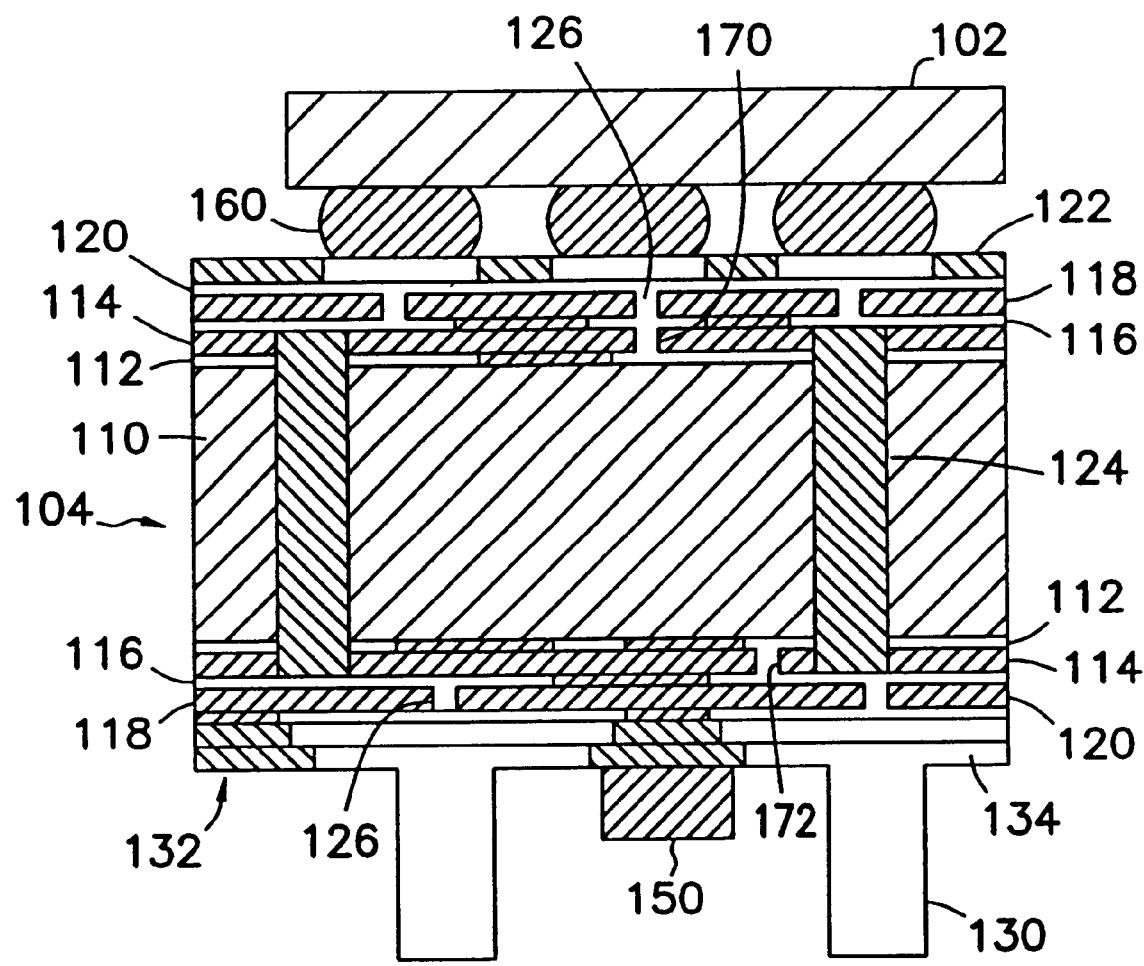
FIG. 3 is a cross section view of another embodiment of the integrated circuit package of FIG. 1.

Second insulating layers 118 are then formed on the second conductive layer, and third conductive layers 120 are formed. Small vias 126 are cut through the second insulating layer and third conductive layer using a laser to expose the second conductive layer. Likewise, the vias can be cut to expose the underlying first conductive layer. See FIG. 3, illustrating via 170 formed in a stacked manner with via 126, and a via 172 located between the first and second conductive layers. A secondary plating operation is used to coat the vias and form conductive paths. The third conductive layer is then patterned.

Covering the ends of the plated through holes allows for the secondary vias to be placed substantially in line with the plated through holes. By stacking the vias in this manner, routing congestion can be reduced.

The above described 'dielectric-conductor sandwich' is one embodiment of a substrate, other layered substrates are contemplated. For example, a substrate can be provided that is not symmetrical about the base dielectric layer.

In one embodiment, base dielectric layer 110 is comprised of a glass reinforced material. The first and second intermediate dielectric layers can comprise two epoxy resin build-up layers.

Conductive interconnect pins 130 are affixed to a bottom 132 of substrate 104. As illustrated, the pins are T-shaped and have a flat head 134. The pins are affixed, in one embodiment, to the third conductive layer 120 using a solder material. In one embodiment, the solder is comprised of a PbSn alloy. The solder, however, can be a different alloy, such as but not limited to a PbSn, AgSn or SbSn alloy. This configuration is different from more traditional pin attachment techniques. For example, ceramic substrates have been provided that have pins brazed to the substrate. Further, typical organic multilayered substrates use holes drilled into the substrates that receive pins. That is, the pins are inserted into the holes and attached to a conductive layer(s). The present substrate differs in that an organic substrate is provided that has multiple layers of conductors and has pins soldered to an exterior conductive layer. As noted above, the interconnect pins described herein provide for increased conductor routing space when compared to packages that have interconnect pins inserted into a substrate.

In another embodiment, SnAg eutectic solder can be used for the pin joint. In yet another embodiment, it was determined through research that a SnSb solder can be selected.

In addition to the above described features, decoupling capacitors 150 can be added to pads provided on exterior conductive layer 120 (electrical connections of the capacitor is not shown in FIG. 2). The capacitors are located between the connector pins to provide transient charge protection to the integrated circuit. Traditional packages do not place capacitors on the pin side of the substrate. However, by providing pads for the mounting of the pins, solder pads can also be provided for capacitors or other components on the pin side of the package.

As described above, an integrated circuit die 102 is attached to the top of substrate 104 using a flip-chip process. This die can be any type of circuit, but in one embodiment is a microprocessor circuit. As known to those skilled in the art, the die is turned over, or flipped, and aligned with a pattern of bonding pads or solder bumps on a substrate. A reflow procedure is carried out to join solder bumps provided on the die to form a series of solder columns between the die and the substrate. The solder columns serve as conductive connections or leads between an IC in the die and the substrate through which I/O signals are transmitted.

CONCLUSION

An integrated circuit package is provided that includes a multi-layer organic substrate. The substrate has conductive vias provided between isolated conductive layers. The vias are formed using a laser to cut through a dielectric layer separating the conductive layers and a mechanical drill to connect the inner core layers. External interconnects in the form of T-shaped pins are soldered to the substrate of the integrated circuit package. An integrated circuit can be attached to the substrate using a flip-chip technique.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An integrated circuit package comprising:
   an integrated circuit die;
   a organic multi-layer substrate comprising,
      a dielectric base layer,
      first conductor, first dielectric, and second conductor layers respectively fabricated on a top and a bottom of the dielectric base layer; and
   T-shaped conductive pins soldered to an outer most conductor layer located on a bottom of the substrate.

2. The integrated circuit package of claim 1 wherein the substrate further comprises a plated through hole passing through the dielectric base layer, first conductor layer and first dielectric layer, the plated through hole is capped at first and second ends by the second conductor layer.

3. The integrated circuit package of claim 2 wherein the plated through hole has an interior core that is filled with an epoxy material.

4. The integrated circuit package of claim 2 wherein the substrate further comprises a conductive via passing through the first dielectric layer, the conductive via is formed by cutting a hole through the first dielectric layer using a laser and plating the laser cut hole with a conductor material.

5. The integrated circuit package of claim 1 wherein the T-shaped conductive pins are soldered using a solder comprising either a PbSn, AgSn or SbSn.

6. The integrated circuit package of claim 1 further comprising a capacitor coupled to the outer most conductor layer located on the bottom of the substrate.

7. The integrated circuit package of claim 1 wherein the organic multi-layer substrate further comprises:
   a second dielectric layer formed over the second conductor layer;
   a third conductor layer formed over the second dielectric layer;
   first laser vias formed between the second and third conductor layers; and
   second laser vias formed between the first and third conductor layers.

8. The integrated circuit package of claim 7 further comprising a skip via formed between the first and third conductor layers, the skip via electrically couples the first and third conductor layers while not electrically coupling the second conductor layer.

9. A microprocessor package comprising:
   an organic multi-layer substrate comprising,
      a dielectric base layer,
      a first conductor layer fabricated on a top and a bottom of the dielectric base layer,
      a first dielectric layer fabricated on the first conductor layer,
      a second conductor layer fabricated on the first dielectric layer,
      a second dielectric layer fabricated on the second conductor layer, and
      a third conductor layer fabricated on the second dielectric layer, the
   organic multi-layer substrate thereby having at least eleven layers;
   T-shaped conductive pins soldered to the third conductor layer located on a bottom of the substrate; and
   an microprocessor die soldered to the third conductor layer located on a top of the substrate.

10. The microprocessor package of claim 9 wherein the substrate further comprises a plated through hole passing through the dielectric base layer, first conductor layer and first dielectric layer, the plated through hole is covered at first and second ends by the second conductor layer.

11. The microprocessor package of claim 10 wherein the plated through hole has an interior core that is filled with an epoxy material.

12. The microprocessor package of claim 10 wherein the substrate further comprises a conductive via passing through the second dielectric layer, the conductive via is formed by cutting a hole through the second dielectric layer using a laser and plating the laser cut hole with a conductor material.

13. The microprocessor package of claim 9 wherein the conductive via is substantially in line with the plated through hole.

14. The microprocessor package of claim 9 wherein the T-shaped conductive pins are soldered using a solder comprising an alloy of AgSn, PbSn or SbSn.

15. The microprocessor package of claim 9 further comprising a skip via formed between the first and third conductor layers, the skip via electrically couples the first and third conductor layers while not electrically coupling the second conductor layer.

16. A microprocessor package comprising:

an organic multi-layer substrate comprising,
- a dielectric base layer,
- a first conductor layer fabricated on a top and a bottom of the dielectric base layer,
- a first dielectric layer fabricated on the first conductor layer,
- a second conductor layer fabricated on the first dielectric layer,
- a second dielectric layer fabricated on the second conductor layer,
- a third conductor layer fabricated on the second dielectric layer, the organic multi-layer substrate thereby having at least eleven layers,
- a plated through hole passing through the dielectric base layer, first conductor layer and first dielectric layer, the plated through hole is covered at first and second ends by the second conductor layer,
- a conductive via passing through the second dielectric layer, the conductive via is formed by cutting a hole through the second dielectric layer using a laser and plating the laser cut hole with a conductor material;

T-shaped conductive pins soldered to the third conductor layer located on a bottom of the substrate; and a microprocessor die soldered to the third conductor layer located on a top of the substrate.

17. The microprocessor package of claim 16 wherein the T-shaped conductive pins are soldered using a solder comprising an alloy of AgSn, PbSn or SbSn.

18. The microprocessor package of claim 16 further comprising a capacitor coupled to the third conductor layer located on the bottom of the substrate.

* * * * *

UNITED STATES PATENT AND TRADEMARK OFFICE
CERTIFICATE OF CORRECTION

PATENT NO. : 6,430,058 B1
DATED : August 6, 2002
INVENTOR(S) : Robert L. Sankman and Hamid Azimi It is certified that error appears in the above-identified patent and that said Letters Patent is hereby corrected as shown below:

Column 2,
Line 50, delete "." after "FIG. 1;".

Column 3,
Line 36, delete "a" and insert -- the --, therefor.
Line 67, insert -- . -- after "candidates".
Line 67, delete "several" and insert -- Several --, therefor.

Column 5,
Line 48, delete "a" and insert -- an --, therefor.

Column 6,
Line 42, delete "an" and insert -- a --, therefor.

Signed and Sealed this

Thirty-first Day of December, 2002

JAMES E. ROGAN
*Director of the United States Patent and Trademark Office*